(12) United States Patent
Tomohiro

(10) Patent No.: US 9,252,126 B2
(45) Date of Patent: Feb. 2, 2016

(54) MULTI CHIP PACKAGE-TYPE SEMICONDUCTOR DEVICE

(71) Applicant: PS4 Luxco S.a.r.l., Luxembourg (LU)

(72) Inventor: Atsushi Tomohiro, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/796,903

(22) Filed: Mar. 12, 2013

(65) Prior Publication Data

US 2013/0256918 A1 Oct. 3, 2013

(30) Foreign Application Priority Data

Apr. 2, 2012 (JP) .................. 2012-083953

(51) Int. Cl.
*H01L 23/48* (2006.01)
*H01L 23/52* (2006.01)
*H01L 29/40* (2006.01)
*H01L 25/00* (2006.01)
*H01L 23/00* (2006.01)
*H01L 25/065* (2006.01)
*H01L 23/31* (2006.01)
*H01L 21/56* (2006.01)

(52) U.S. Cl.
CPC .............. *H01L 25/00* (2013.01); *H01L 24/97* (2013.01); *H01L 25/0657* (2013.01); *H01L 21/561* (2013.01); *H01L 23/3128* (2013.01); *H01L 2224/16225* (2013.01); *H01L 2224/32145* (2013.01); *H01L 2224/32225* (2013.01); *H01L 2224/48091* (2013.01); *H01L 2224/49175* (2013.01); *H01L 2224/73204* (2013.01); *H01L 2224/73253* (2013.01); *H01L 2224/73265* (2013.01); *H01L 2224/92247* (2013.01); *H01L 2224/97* (2013.01); *H01L 2225/0651* (2013.01); *H01L 2225/06517* (2013.01); *H01L 2225/06558* (2013.01); *H01L 2225/06562* (2013.01); *H01L 2225/06568* (2013.01); *H01L 2225/06575* (2013.01); *H01L 2924/15311* (2013.01)

(58) Field of Classification Search
CPC ................. H01L 25/0657; H01L 2224/48145; H01L 25/117; H01L 25/00; H01L 24/97
USPC ................................... 257/777, 686, E23.169
See application file for complete search history.

(56) References Cited

U.S. PATENT DOCUMENTS

| | | | |
|---|---|---|---|
| 6,713,856 B2 * | 3/2004 | Tsai et al. | 257/686 |
| 6,818,998 B2 | 11/2004 | Kwon et al. | |
| 7,115,483 B2 | 10/2006 | Kwon et al. | |
| 7,148,081 B2 | 12/2006 | Higashino et al. | |
| 7,626,253 B2 * | 12/2009 | Onodera et al. | 257/686 |
| 7,928,551 B2 | 4/2011 | Fujiwara et al. | |
| 8,198,718 B2 * | 6/2012 | Usami | 257/686 |
| 2002/0149102 A1 * | 10/2002 | Hashemi et al. | 257/706 |

(Continued)

FOREIGN PATENT DOCUMENTS

| | | |
|---|---|---|
| JP | 2003-078106 A | 3/2003 |
| JP | 2004-356529 A | 12/2004 |

(Continued)

*Primary Examiner* — Thien F Tran

(57) ABSTRACT

A semiconductor device includes a wiring board, a first semiconductor chip mounted on the wiring board via a first adhesive member, and second semiconductor chip stacked on the first semiconductor chip via a second adhesive member. The first adhesive member is a die attach film having an adhesive layer formed on both surfaces of an insulating base, and the second adhesive member is an adhesive paste.

17 Claims, 5 Drawing Sheets

(56) References Cited

U.S. PATENT DOCUMENTS

2008/0150157 A1* 6/2008 Nishimura et al. ........... 257/777
2009/0283918 A1* 11/2009 Chyan ........................... 257/777

FOREIGN PATENT DOCUMENTS

| | | |
|---|---|---|
| JP | 2005-101312 A | 4/2005 |
| JP | 2009-099697 A | 5/2009 |

* cited by examiner

MULTI CHIP PACKAGE-TYPE SEMICONDUCTOR DEVICE

This application is based upon and claims the benefit of priority from Japanese patent application No. 2012-083953, filed on Apr. 2, 2012, the disclosure of which is incorporated herein in its entirety by reference.

BACKGROUND OF THE INVENTION

This invention relates to a semiconductor device and particularly to a MCP (Multi Chip Package)-type semiconductor device.

An MCP-type semiconductor device is known having a plurality of semiconductor chips stacked on a wiring board.

This type of semiconductor device uses, for example, an adhesive member having an adhesive layer on both surfaces on an insulating sheet member (die attach film) in order to fix the stacked semiconductor chips to each other. Such a semiconductor device is described in Japanese Patent Application Publication No. 2009-099697. Alternatively, a paste-type or film-type adhesive may be used. Such a semiconductor device is described in Japanese Patent Application Publication No. 2003-078106, No. 2004-356529, or No. 2005-101312.

SUMMARY

A die attach film does not have fluidity unlike a paste-type adhesive, but has a certain shape. The die attach film therefore enables a plurality of semiconductor chips to be stably stacked substantially in parallel.

However, die attach films have a problem that they are very expensive.

On the other hand, paste-type or film-type adhesives, principally composed of a thermoplastic or thermosetting resin, are not expensive.

However, this type of adhesive exhibits fluidity and possibly changes its shape significantly in a bonding process. Therefore, the semiconductor chips might possibly be mounted in an inclined state with respect to a wiring board due to biased load applied when the semiconductor chips are mounted, ununiformity of components of the adhesive (e.g., variation in diameter of filler), or uneven surface due to wiring pattern on the wiring board.

If a lower semiconductor chip is inclined, it makes it difficult to stack an upper semiconductor chip thereon. Further, the inclination of the lower semiconductor chip not only is followed by but also can be amplified by the upper semiconductor chip. The inclination of the semiconductor chips makes wire bonding difficult or even impossible.

As described above, a semiconductor device formed by stacking a plurality of semiconductor chips with use of paste-type or film-type adhesive has a problem that stable assembly is difficult.

The present invention seeks to solve the problem or to improve upon the problem at least in part.

In one embodiment, there is provided a device that includes a wiring board, a first semiconductor chip mounted on the wiring board via a first adhesive member, and a second semiconductor chip stacked on the first semiconductor chip via a second adhesive member. The first adhesive member is a die attach film having an adhesive layer provided on both surfaces of an insulating base. The second adhesive member is an adhesive paste.

In another embodiment, there is provided a device that includes a wiring board and a plurality of semiconductor chips stacked on the wiring board. An uppermost semiconductor chip of the plurality of semiconductor chips is bonded to an adjacent one of the semiconductor chips by a paste-type adhesive member while each of the other semiconductor chips is bonded to an adjacent one of the semiconductor chips or wiring board by a film-type adhesive member including an insulating base.

In a still another embodiment, there is provided a device that includes a wiring board; a first semiconductor chip mounted on the wiring board by a first adhesive member, the first adhesive member consisting of a die attach film including an insulating base, a lower adhesive layer adhered the wiring board to the insulating base, and an upper adhesive layer adhered the first semiconductor chip to the insulating base; and a second semiconductor chip stacked on the first semiconductor chip by a second adhesive member, and the second adhesive member consisting of an adhesive paste.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1A:
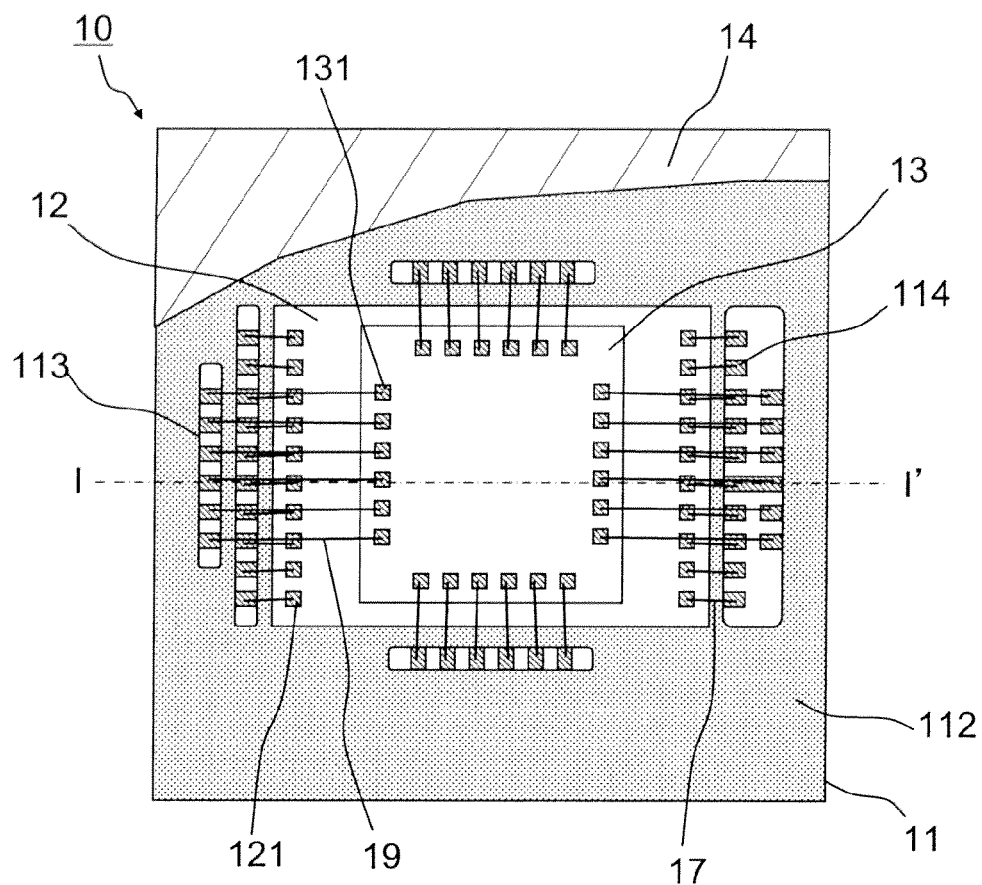
FIG. 1A is a plan view showing a semiconductor device according to a first embodiment of the invention.
Figure 1B:
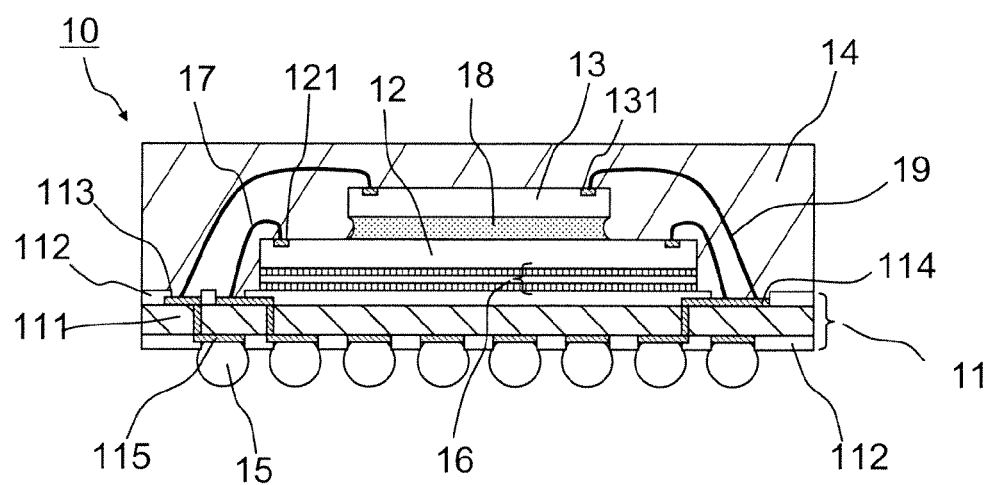
FIG. 1B is a cross-sectional view taken along line I-I' in FIG. 1A.

FIG. 1A is a plan view showing a schematic configuration of a MCP type semiconductor device 10 according to a first embodiment of the invention. In order to facilitate understanding, the semiconductor device 10 is shown in a state in which most of an encapsulation resin 14 has been removed. FIG. 1B is a cross-sectional view taken along line I-I' in FIG. 1A.

The semiconductor device 10 shown in FIGS. 1A and 1B has a wiring board 11, a first semiconductor chip 12 mounted on the wiring board 11, a second semiconductor chip 13 stacked on the first semiconductor chip 12, and an encapsulation resin 14 for encapsulating these semiconductor chips 12, 13 on the wiring board 11.

The wiring board 11 includes an insulating base 111 with a substantially square planar shape, wirings (not shown) formed on the opposite surfaces of the insulating base 111, and a pair of insulating films (made of solder resist (SR)) 112 covering the surfaces of the wirings and the base 111. If necessary, the wirings formed on the opposite surfaces of the base 111 are mutually connected through vias passing through the insulating base 111. A plurality of connection pads 114 are formed and arranged near the periphery of one surface of the wiring board 11 such that the connection pads 114 are exposed from each of a plurality of openings 113 formed in the insulating film 112. A plurality of lands 115 are arranged in matrix on the other surface of the wiring board 11 so that solder balls 15 are mounted thereon. Each of the connection pads 114 is connected to corresponding one of the lands 115 through the wiring. The wiring board 11 may be, for example, a glass-epoxy substrate with a thickness of about 0.2 mm.

The first semiconductor chip 12 has a substantially rectangular planar shape, and has a predetermined circuit, for example a memory circuit (not shown) formed on one surface thereof. A plurality of electrode pads 121 are arranged on the one surface of the first semiconductor chip 12, along a pair of opposite sides of the rectangle, for example along the short sides. The first semiconductor chip 12 is adhesively fixed at a substantially central portion of the one surface of the wiring board 11 by means of a first adhesive member 16. Each of the electrode pads 121 is electrically connected to a corresponding one of the connection pads 114 on the wiring board 11 by means of a wire 17 made of a conductive material such as Au. The first adhesive member 16 is a member having adhesive layers on both surfaces of an insulating sheet member (insulating base), such as a DAF (die attach film). Lower one of the adhesive layers adheres to the wiring board 11 and to the insulating base while upper one of the adhesive layer adheres to the insulating base and to the first semiconductor chip 13. The first adhesive member 16 has edges are substantially coplanar with edges of the first semiconductor chip 12.

When a gel paste material is used as an adhesive, the assembly will be affected by biased load, non-uniformity of components of the paste material, and surface irregularity due to wiring patterns on the wiring board 11. However, when the first semiconductor chip 12 is mounted on the wiring board 11 with use of a DAF as in this embodiment, the assembly is not affected by such factors, and the first semiconductor chip 12 can be mounted in high parallelism with the wiring board 11.

The second semiconductor chip 13 is of a substantially square planar shape, and a predetermined circuit, for example a logic circuit is formed on one surface thereof. A plurality of electrode pads 131 are arranged along four sides on the one surface of the second semiconductor chip 13. The second semiconductor chip 13 is adhesively fixed to a substantially central part of the one surface of the first semiconductor chip 12 by means of a second adhesive member 18 so as to avoid a region where electrode pads 121 are formed. The second semiconductor chip 13 is formed to have a smaller chip size (planar area) than that of the first semiconductor chip 12 such that the second semiconductor chip 13 will not cover the electrode pads 121 of the first semiconductor chip 12 when the second semiconductor chip 13 is stacked on the first semiconductor chip 12. The plurality of electrode pads 131 are electrically connected to the corresponding connection pads 114 of the wiring board 11 by means of wires 19 made of a conductive material such as Au.

Unlike the first adhesive member 16, the second adhesive member 18 is a single layer without including an insulating base. For instance, the second adhesive member 18 is an adhesive paste made of an insulating resin. The use of an adhesive paste makes it possible to reduce the cost in comparison with when a DAF is used. The second adhesive member is in direct contact with the first semiconductor chip 12 and with the second semiconductor chip 13. The second adhesive member includes edges which are dented from edges of the second semiconductor chip 13.

The second semiconductor chip 13 can be mounted without covering the electrode pads 121 of the first semiconductor chip 12 with adhesive paste by controlling the area where the adhesive paste is applied and the amount of the adhesive paste applied so as to prevent the adhesive paste from spreading out.

One surface of the first semiconductor chip 12 is smooth without such irregularity caused by wiring patterns on one surface of the wiring board 11. Additionally, the second semiconductor chip 13 has a smaller chip size (planar shape size) than the first semiconductor chip 12, and hence the effect of biased load and non-uniformity of paste material caused by the use of a gel paste material is minimized. Therefore, even if the second semiconductor chip 13 is stacked on the first semiconductor chip 12 with use of an adhesive paste, it is unlikely that the second semiconductor chip 13 is inclined with respect to the first semiconductor chip 12. Moreover, since the first semiconductor chip 12 is mounted in high parallelism with the wiring board 11 by means of the first adhesive member 16, it is highly probable that the second semiconductor chip 13 is also stacked and mounted in high parallelism with the wiring board 11. As a result, assembly failure caused by use of the adhesive paste is suppressed and reduction of fabrication yield is also suppressed.

The wires 19 connecting between the electrode pads 131 of the second semiconductor chip 13 and the connection pads 114 of the wiring board 11 can be formed by reverse bonding (a method of performing a first bonding to connect the connection pads 114 of the wiring board 11 and then performing a second bonding to connect the electrode pads 131 of the semiconductor chip 13). This method makes it possible to reduce the degree of looping of the wires connected to the upper semiconductor chip 13, to reduce the thickness of the encapsulation resin 14, and to reduce the thickness of the semiconductor device 10.

A method of manufacturing the semiconductor device 10 according to the first embodiment will be described with reference to FIGS. 2A to 2F.

Figure 2A:
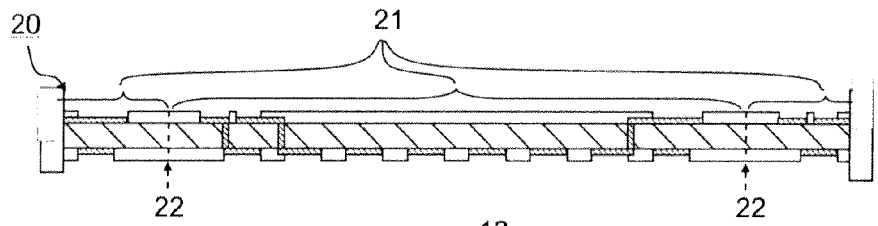
FIGS. 2A to 2F are process charts showing manufacturing processes of the semiconductor device of FIGS. 1A and 1B.

Firstly, a wiring mother board 20 as shown in FIG. 2A is prepared. The wiring mother board 20 has a plurality of product formation regions 21 defined thereon. Predetermined wirings, connection pads and the like are formed in each of the product formation regions 21. The wiring mother board 20 is cut along dicing lines 22 into a plurality of wiring boards 11 in a later step.

Figure 2B:
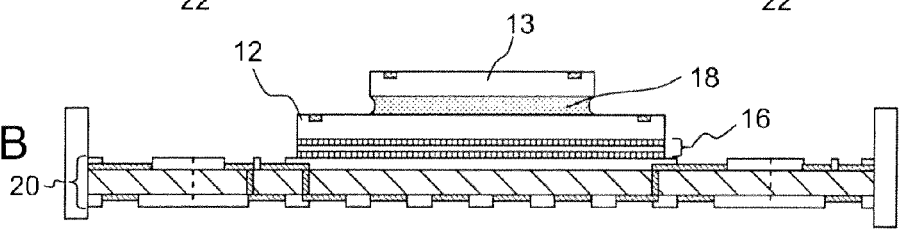

Next, as shown in FIG. 2B, a first semiconductor chip 12 having a first adhesive member 16 bonded to a first surface thereof (the lower surface in the drawing) is mounted on the wiring mother board 20. A OAF serving as the first adhesive member 16 is obtained by being bonded to the first surface of the first semiconductor chip 12 (the rear face of a wafer) when the first semiconductor chip 12 is still in a wafer state, and being cut off together with the first semiconductor chip 12 when the wafer is divided into separate semiconductor chips.

Subsequently, a second adhesive member 18 is applied on a predetermined region on a second surface (the upper surface in the drawing) of the first semiconductor chip 12, and a second semiconductor chip 13 is stacked on the first semiconductor chip 12. Specifically, a predetermined amount of a paste material serving as the second adhesive member 18 is applied on the predetermined region of the first semiconductor chip 12. The second semiconductor chip 13 is placed on the applied paste material and a load is applied thereto while heating. The paste material is spread over between the semiconductor chips by the load and hardened by the heating. The second semiconductor chip 13 is thus adhesively fixed onto the first semiconductor chip 12.

Figure 2C:
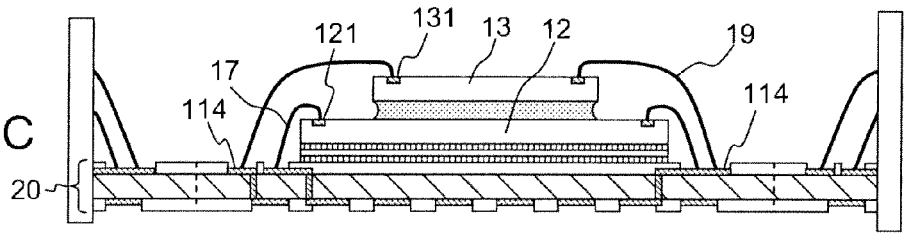

As shown in FIG. 2C, the electrode pads 121 and 131 of the first and second semiconductor chips 12 and 13 are electrically connected to the corresponding connection pads 114 on the wiring mother board 20 by means of wires 17 and 19. This connection can be performed using metallic wires of Au or the like, by means of a wire bonding device (not shown). More specifically, the tip end of each wire formed into a ball by melting is ultrasonic thermo-compression bonded to the corresponding electrode pad 121 on the first semiconductor chip 12. The wire is led so as to form a predetermined loop shape and the trailing end of the wire is ultrasonic thereto-compression bonded to the corresponding connection pad 114. The connection between the electrode pads 131 of the second semiconductor chip 13 and the corresponding connection pads 114 is also carried out in the same manner. As described before, at least the connection between the electrode pads 131 of the second semiconductor chip 13 and the corresponding connection pads 114 can be performed by reverse bonding.

Figure 2D:
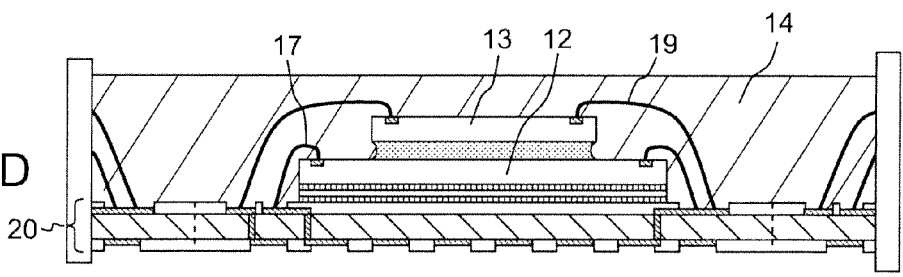

Next, as shown in FIG. 2D, collective molding is performed to form an encapsulation resin 14 on the second (upper) surface of the wiring mother board 20, whereby the first and second semiconductor chips 12 and 13 are encapsulated together with the wires 17 and 19. This encapsulation can be performed by means of a transfer molding device, for example. Specifically, the wiring mother board 20 having the semiconductor chips 12 and 13 mounted thereon is placed in a cavity formed by upper and lower halves of a mold of the transfer molding device (not shown), and a thermosetting epoxy resin is forced into the cavity and thermally hardened.

Figure 2E:
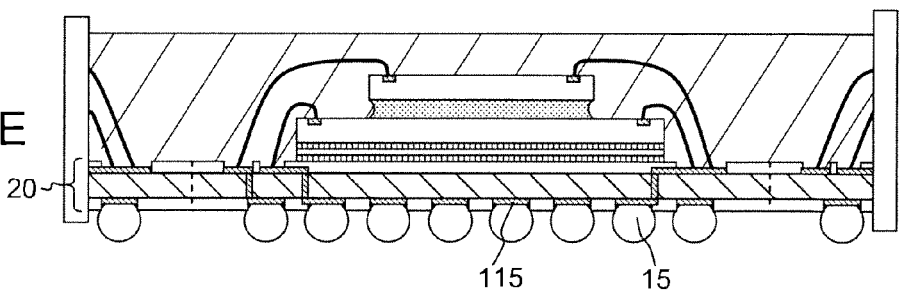

As shown in FIG. 2E, the wiring mother board 20 is taken out of the mold, and solder balls 15 are mounted on the lands 115 on the first (lower) surface of the wiring mother board 20. The mounting of the solder balls 15 is performed by using a suction mechanism having a plurality of suction holes formed according to the arrangement of the lands 115 on the wiring mother board 20. The plurality of solder balls 15 are held at the suction holes by the suction mechanism, flux is transferred onto the solder balls 15 thus held, and the solder balls 15 are collectively mounted on the lands 115 of the wiring mother board 20. After being mounted, the solder balls 15 are reflown so that the solder balls 15 are connected and fixed to the lands 115. The solder balls 15 function as external terminals of the semiconductor device 10.

Figure 2F:
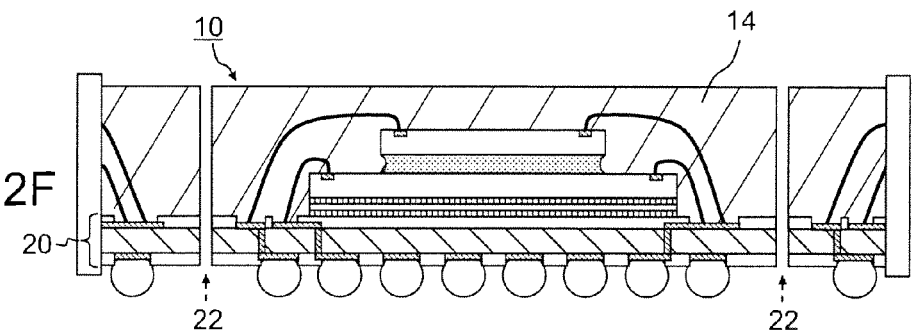

Finally, as shown in FIG. 2F, the wiring mother board 20 is cut (diced) together with the encapsulation resin 14 along dicing lines 22 so as to separate semiconductor devices 10. The dicing is performed by affixing the encapsulation resin 14 on dicing tape (not shown) so that the wiring mother board 20 is supported by the dicing tape. In this state, the wiring mother board 20 and the encapsulation resin 14 are cut in longitudinal and width directions along the dicing lines 22 by means of a dicing blade (not shown). Semiconductor devices 10 as shown in FIGS. 1A and 1B can be obtained by picking up from the dicing tape after completing the separation.

In the method of manufacturing a semiconductor device according to the first embodiment, a DAF is used for mounting the first semiconductor chip 12 on the wiring board 11, and a paste material is used for stacking the second semiconductor chip 13 on the first semiconductor chip 12. This makes it possible to improve the degree of parallelism of the first and second semiconductor chips 12 and 13 with respect to the wiring board 11, to ensure stable assembling, and to reduce the assembly cost. Further, since the stable assembling can be ensured, the yield of manufacturing can be improved.

Next, a semiconductor device according to a second embodiment of the invention will be described with reference to FIGS. 3A and 3B. Like components to those of the first embodiment are indicated by the same reference numerals and description thereof will be omitted.

Figure 3A:
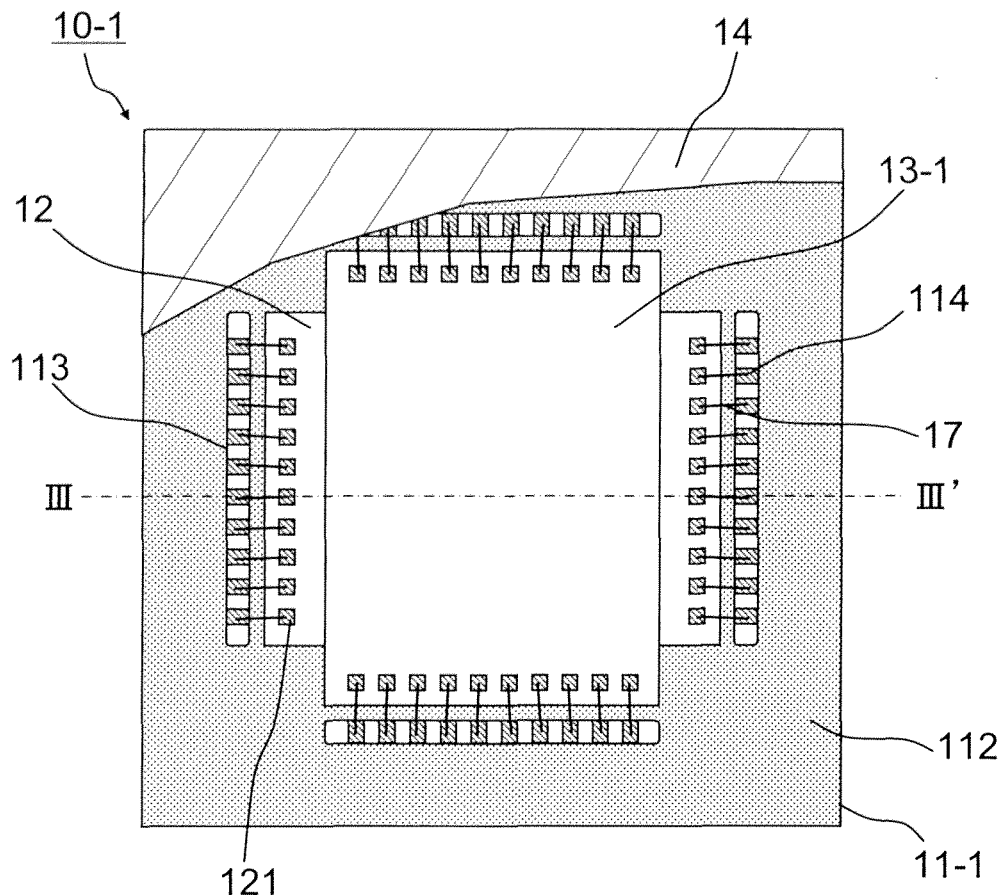
FIG. 3A is a plan view showing a semiconductor device according to a second embodiment of the invention.
Figure 3B:
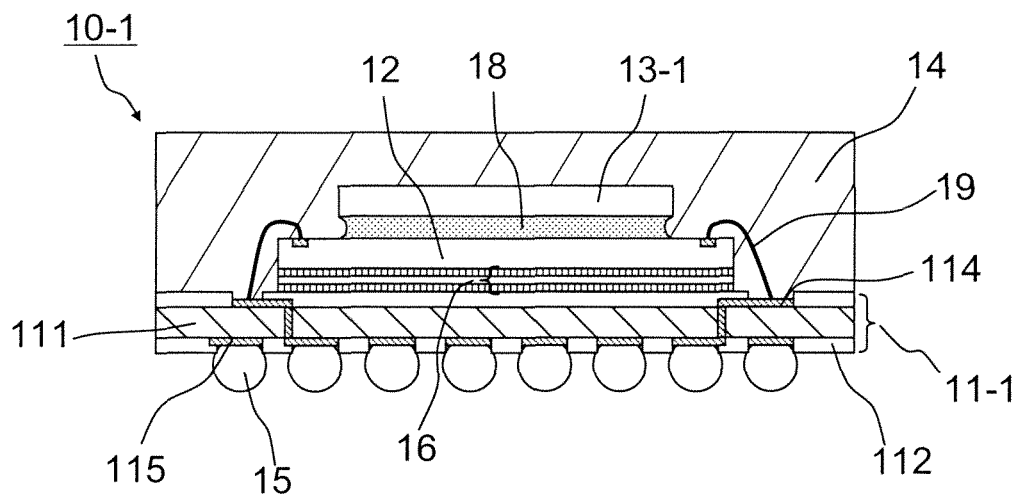
FIG. 3B is a cross-sectional view taken along line in FIG. 3A.

FIG. 3A is a plan view showing a schematic configuration of an MCP-type semiconductor device 10-1 according to the second embodiment, and FIG. 3B is a cross-sectional view taken along line in FIG. 3A.

Basic configuration of the semiconductor device 10-1 is the same as that of the semiconductor device 10 shown in FIG. 1. Specifically, in the semiconductor device 10-1 as well, a first semiconductor chip 12 is mounted on a wiring board 11-1 via a first adhesive member 16, and a second semiconductor chip 13-1 is stacked and mounted on the first semiconductor chip 12 via a second adhesive member 18.

The second embodiment is different from the first embodiment in that the second semiconductor chip 13-1 has the same shape as that of the first semiconductor chip 12. This means that the second semiconductor chip 13-1 is of a substantially rectangular planar shape, and a plurality of electrode pads are arranged along opposite two sides of the rectangle. An internal circuit included in the second semiconductor chip 13-1 may be the same as or different from that of the first semiconductor chip 12.

As shown in FIG. 3A, the second semiconductor chip 13-1 and the first semiconductor chip 12 are arranged such that their longitudinal directions intersect with each other. Particularly, the second semiconductor chip 13-1 is arranged on the first semiconductor chip 12 in a position rotated by 90 degrees with respect to the first semiconductor chip 12 and such that the second semiconductor chip 13-1 will not overlap with the region of the first semiconductor chip 12 where the electrode pads 121 are formed. The second semiconductor chip 13-1 is thus adhesively fixed to the first semiconductor chip 12 with use of an adhesive paste serving as the second adhesive member 18.

In the wiring board 11-1, the numbers and positions of wirings and connection pads 114 are changed so as to cope with the second semiconductor chip 13-1.

This second embodiment also provides the same effect as that of the first embodiment by using a DAF as the first adhesive member 16, and using a paste material as the second adhesive member 18.

In this embodiment, there is no adhesive member on the lower surface (the surface facing the wiring board 11-1) of an overhang of the second semiconductor chip 13-1 (a portion projecting out from the edge of the first semiconductor chip 12). Thus, the gap between the second semiconductor chip 13-1 and the wiring board 11-1 can be made greater than when a DAF is used. This is because when a DAF is used, the DAF is provided on the entire lower surface of the second semiconductor chip 13-1. Since the gap between the second semiconductor chip 13-1 and the wiring board 11-1 can be made greater, the packing properties of the encapsulation resin 14 can be improved, and generation of voids under the overhang of the second semiconductor chip 13-1 can be suppressed. This improves the reliability of the semiconductor device 10-1.

While the description of this second embodiment has been made of a case in which the semiconductor device includes two semiconductor chips 12 and 13-1, it can include three or more semiconductor chips which are each formed into a rectangular planar shape and are stacked alternately such that the their longitudinal directions intersect with each other. In such a case, the uppermost semiconductor chip may be bonded to its underlying (or an adjacent) semiconductor chip by means of a paste-type adhesive member. Moreover, each of the other semiconductor chips may be bonded to its underlying (or an adjacent) semiconductor chip or a wiring board by means of a film-type adhesive member such as a DAF. The semiconductor chips are electrically connected to the wiring board by wiring bonding and encapsulated on the wiring board together with wirings by means of a resin.

Figure 4A:
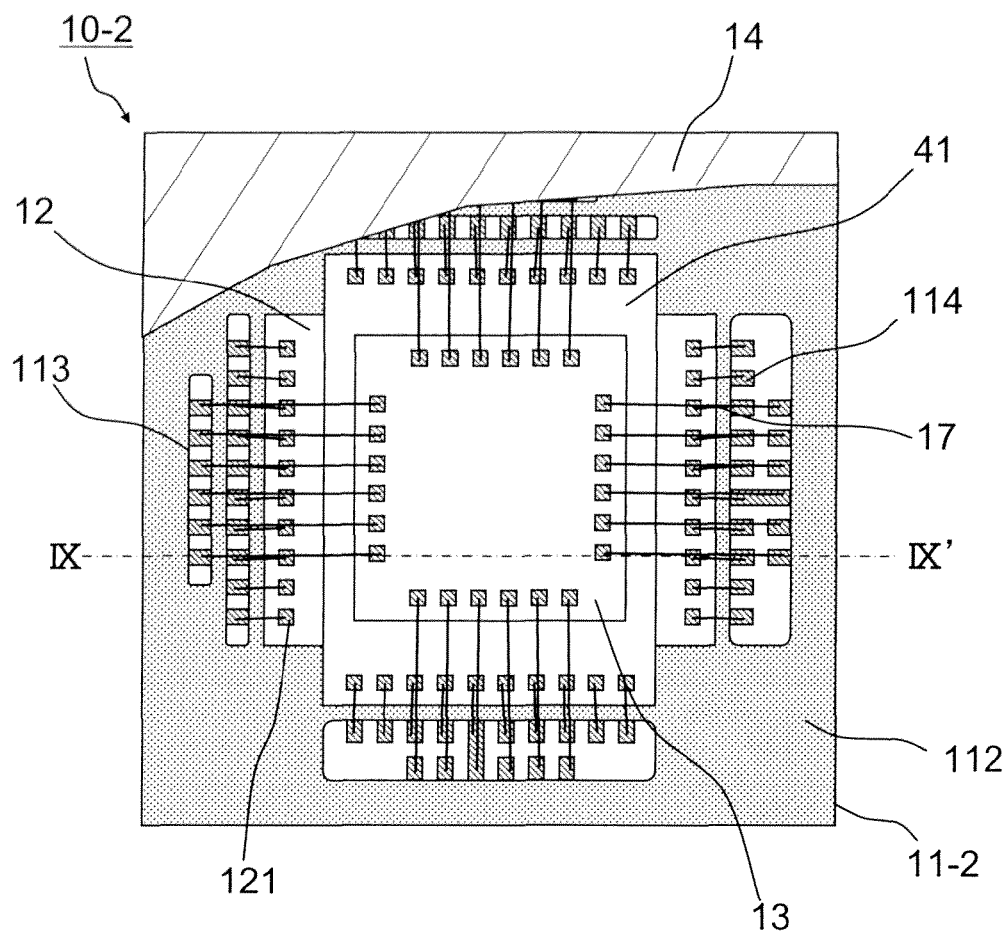
FIG. 4A is a plan view showing a semiconductor device according to a third embodiment of the invention.
Figure 4B:
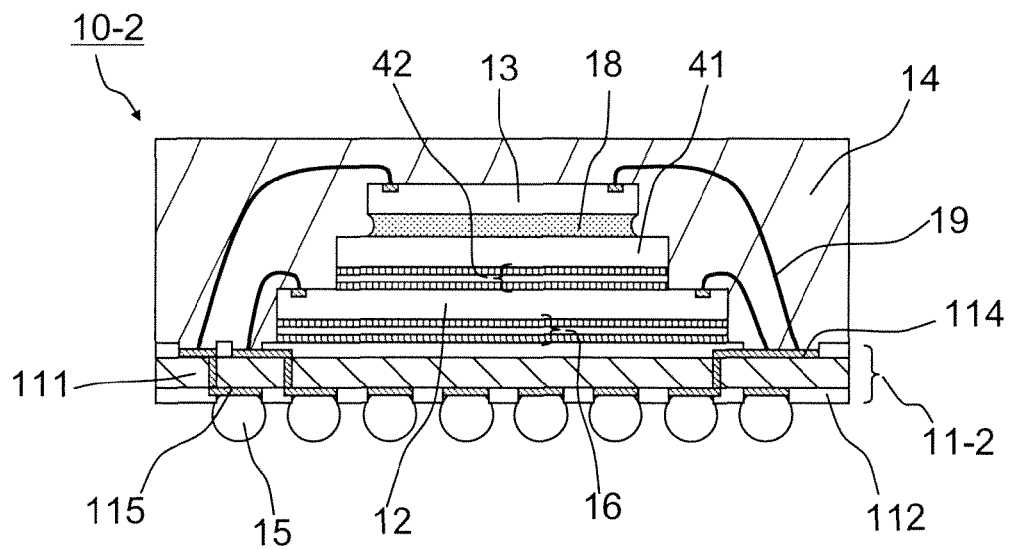
FIG. 4B is a cross-sectional view taken along line IX-IX' in FIG. 4A.

Next, a semiconductor device according to a third embodiment of the invention will be described with reference to FIGS. 4A and 4B. In FIGS. 4A and 4B, like components to those of the first embodiment are indicated by the same reference numerals and description thereof will be omitted.

FIG. 4A is a plan view showing a schematic configuration of an MCP-type semiconductor device 10-2 according to the third embodiment, and FIG. 4B is a cross-sectional view taken along line IX-IX' in FIG. 4A.

The semiconductor device 10-2 is different from the semiconductor device 10 according to the first embodiment in that a third semiconductor chip 41 is arranged between the first semiconductor chip 12 and the second semiconductor chip 13.

The third semiconductor chip 41 has the same shape as that of the first semiconductor chip 12. Specifically, the third semiconductor chip 41 is of a substantially rectangular planar shape, and a plurality of electrode pads are arranged along opposite two sides of the rectangle. An internal circuit included in the third semiconductor chip 41 may be the same as or different from the one in the first semiconductor chip 12. It is assumed here that the first and third semiconductor chips 12 and 41 are memory chips and the second semiconductor chip 13 is a logic chip.

As shown in FIG. 4A, the third semiconductor chip 41 is arranged on the first semiconductor chip 12 in a position rotated by 90 degrees with respect to the first semiconductor chip 12 and such that the third semiconductor chip 41 will not overlap with the region of the first semiconductor chip 12 where the electrode pads 121 are formed. The third semiconductor chip 41 is thus adhesively fixed to the first semiconductor chip 12 with use of a DAF serving as a third adhesive member 42.

The second semiconductor chip 13 is arranged on the third semiconductor chip 41, and is adhesively fixed thereto with use of an adhesive paste as the second adhesive member 18.

The numbers and positions of wirings and connection pads 114 on the wiring board 11-2 are changed so as to cope with the presence of the third semiconductor chip 41.

In the semiconductor device 10-2 according to the third embodiment, a third semiconductor chip 41 is stacked on the first semiconductor chip 12 via a DAF serving as the third adhesive member 42. Therefore, like the first semiconductor chip 12, the third semiconductor chip 41 can be stacked and mounted in high parallelism with the wiring board 11-2. Accordingly, the same effect as in the first embodiment can be obtained.

While the description of this third embodiment has been made of a case in which one third semiconductor chip 41 is stacked between the first semiconductor chip 12 and the second semiconductor chip 13, two or more third semiconductor chips can be stacked between them. This makes it possible to enhance the capacity or function of the semiconductor device. In such a case, they may be stacked alternately such that the their longitudinal directions intersect with each other.

Even if two or more third semiconductor chips 41 are stacked between the first semiconductor chip 12 and the second semiconductor chip 13, the same effect can be obtained by adhesively fixing the these semiconductor chips with use of DAFs serving as the third adhesive members 42.

Next, a semiconductor device according to a fourth embodiment of the invention will be described with reference to FIG. 5. Like components to those of the first embodiment are indicated by the same reference numerals and description thereof will be omitted.

Figure 5:
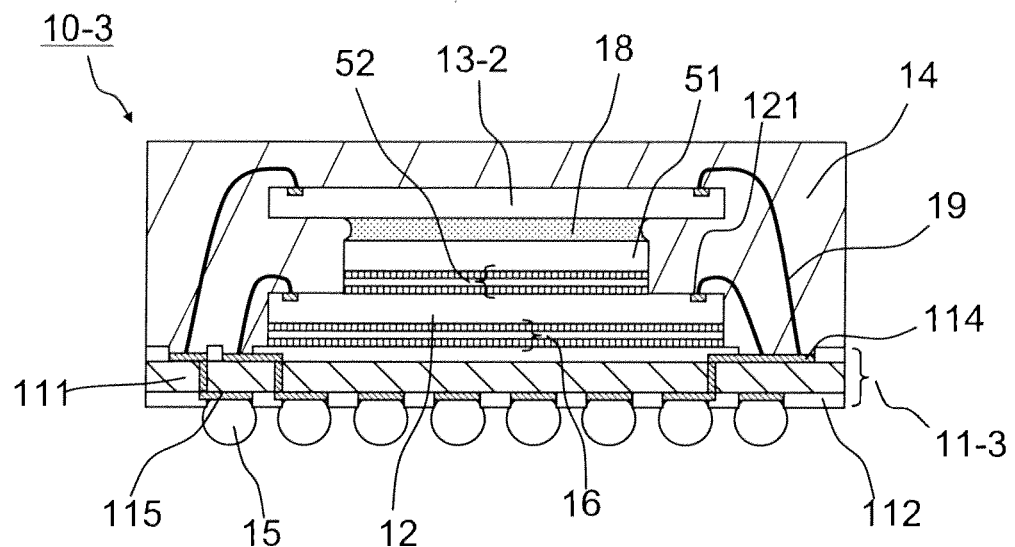
FIG. 5 is a longitudinal sectional view showing a semiconductor device according to a fourth embodiment of the invention.

FIG. 5 is a cross-sectional view showing a schematic configuration of an MCP-type semiconductor device 10-3 according to the fourth embodiment.

The semiconductor device 10-3 is different from the semiconductor device 10 according to the first embodiment in that a second semiconductor chip 13-2 has the same shape as that of the first semiconductor chip 12 and is stacked on the first semiconductor chip 12 in the same orientation. In order to realize this configuration, a spacer 51 is provided between the first semiconductor chip 12 and the second semiconductor chip 13-2.

The spacer 51 is formed of a silicon substrate, for example. The spacer 51 has a similar size to that of the second semiconductor chip 13 in the first embodiment so that the spacer 51 is mounted on a region other than the region on the first semiconductor chip 12 where the electrode pads 121 are formed. The spacer 51 is adhesively fixed onto the first semiconductor chip 12 with use of a DAF functioning as a third adhesive member 52.

The second semiconductor chip 13-2 is stacked on the spacer 51 via a second adhesive member 18. A part of the second semiconductor chip 13-2 is protruded from the spacer 51. The second adhesive member 18 is not provided to the protruded part.

In the wiring board 11-3, the numbers and positions of wirings and connection pads 114 are changed so as to cope with the second semiconductor chip 13-2.

In this fourth embodiment as well, the first semiconductor chip 12 and the spacer 51 are mounted with use of DAFs respectively functioning as first and third adhesive members 16 and 52, and the second semiconductor chip 13-2 is mounted with use of a paste material functioning as the second adhesive member 18. Therefore, the fourth embodiment also provides the same effects as those of the first embodiment.

Further, according to the fourth embodiment, when the first semiconductor chip 12 and the second semiconductor chip 13-2 are the same memory chips, they are arranged such that electrode pads which are functionally the same overlap with each other in a stacking direction. This makes it possible to use in common at least some of the connection pads 114 on the wiring board 11-3 corresponding to the electrode pads of the first semiconductor chip 12 with the connection pads 114 on the wiring board 11-3 corresponding to the electrode pads of the second semiconductor chip 13-2. This makes it possible to simplify the wiring of the wiring board 11-3.

While the description of this fourth embodiment has been made of a case in which the semiconductor device includes two semiconductor chips 12 and 13-2, it can include three or more semiconductor chips which are stacked via spacers. In such a case, each of the spacers may be bonded to its underlying (or an adjacent) semiconductor chip by means of the film-type adhesive member. The upper most semiconductor chip may be bonded to its underlying spacer by means of the paste-type adhesive member. Alternatively, the upper most semiconductor chip may be bonded to its underlying semiconductor chip like the second semiconductor chip 13 of the first embodiment or 13-1 of the second embodiment. The remaining semiconductor chips are bonded to its underlying (or an adjacent) spacer or a wiring board by means of the film-type adhesive member. The semiconductor chips are electrically connected to the wiring board by wiring bonding and encapsulated on the wiring board together with wirings by means of a resin.

Next, a semiconductor device according to a fifth embodiment of the invention will be described with reference to FIG. 6. Like components to those of the first embodiment are indicated by the same reference numerals and description thereof will be omitted.

Figure 6:
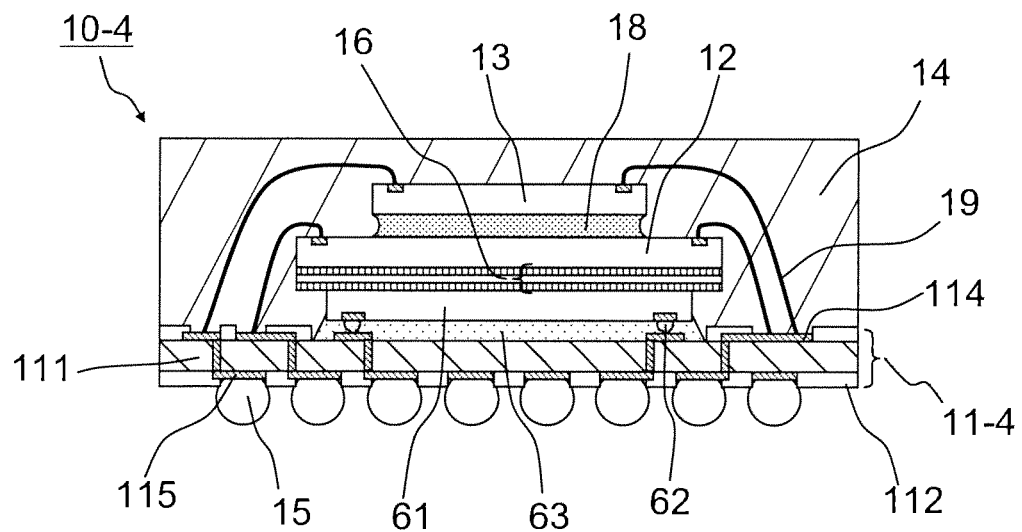
FIG. 6 is a longitudinal sectional view showing a semiconductor device according to a fifth embodiment of the invention.

FIG. 6 is a cross-sectional view showing a schematic configuration of an MCP-type semiconductor device 10-4 according to this embodiment.

The semiconductor device 10-4 is different from the semiconductor device 10 according to the first embodiment in that a third semiconductor chip 61 is arranged between a wiring board 11-4 and a first semiconductor chip 12.

The third semiconductor chip 61 includes a plurality of bump electrodes 62 on its one surface. The third semiconductor chip 61 is mounted on the wiring board 11-4 by flip chip bonding, for example. Specifically, the third semiconductor chip 61 is connected and fixed to the wiring board 11-4 via bump electrodes 62. The third semiconductor chip 61 has a chip size (planar shape size) that is the same as or smaller than that of the first semiconductor chip 12. If the third semiconductor chip 61 is too small in size, the first semiconductor chip cannot be mounted stably. The gap between the third semiconductor chip 61 and the wiring board 11-4 is filled with an underfill material 63.

The first semiconductor chip 12 is arranged on the third semiconductor chip 61 and adhesively fixed thereto with use of a DAF serving as the first adhesive member 16.

In the wiring board 11-4, the numbers and positions of wirings and connection pads 114 are changed so as to cope with the presence of the second semiconductor chip 13-1.

This fifth embodiment also provides the same effect as that of the first embodiment as long as the flip-chip mounted third semiconductor chip 61 has a predetermined degree of parallelism with respect to the wiring board 11-4.

While the description of this fifth embodiment has been made of a case in which the third semiconductor chip 61 is arranged under the first semiconductor chip 12, it is possible to combine the third semiconductor 61 with any one of the second to the fourth embodiments. In any one case, the third semiconductor 61 serves as a lowermost semiconductor chip that is bonded to the wiring board via a plurality of bump electrodes.

While the invention has been described based on several exemplary embodiments, the invention is not limited to these embodiments, but can be varied or modified in various manners without departing from the scope of the invention.

For example, while in the foregoing embodiments a glass-epoxy substrate is used as the wiring board, a flexible wiring board including a polyimide base or a wiring board including a ceramic base may be used instead of the glass-epoxy substrate.

Further, while the description of the foregoing embodiments has been made based on an MCP-type semiconductor device in which two memory chips or a memory chip and a logic chip are stacked, the invention is not limited to this, but is applicable to any combination of semiconductor chips.

What is claimed is:
1. A device comprising:
   a wiring board;
   a first semiconductor chip mounted on the wiring board via a first adhesive member; and
   a second semiconductor chip stacked on the first semiconductor chip via a second adhesive member,
   wherein the first adhesive member comprises a die attach film including adhesive layers on both surfaces of an insulating base, the second adhesive member comprises an adhesive paste,
   an edge of the first adhesive member is substantially coplanar with an edge of the first semiconductor chip, and
   an edge of the second adhesive member is dented from an edge of the second semiconductor chip.

2. The device according to claim 1, further comprising a third semiconductor chip stacked between the first semiconductor chip and the second semiconductor chip, wherein:
   the third semiconductor chip is stacked on the first semiconductor chip via a third adhesive member;
   the second semiconductor chip is stacked on the third semiconductor chip via the second adhesive member; and
   the third adhesive member comprises a die attach film including adhesive layers on both surfaces of an insulating base.

3. The device according to claim 1, further comprising a spacer stacked between the first semiconductor chip and the second semiconductor chip, wherein:
   the spacer is stacked on the first semiconductor chip via a third adhesive member;
   the second semiconductor chip is stacked on the spacer via the second adhesive member; and
   the third adhesive member comprises a die attach film including adhesive layers on both surfaces of an insulating base.

4. The device according to claim 3, wherein a part of the second semiconductor chip is protruded from the spacer, and the second semiconductor chip is bonded to the spacer by the second adhesive member without providing the second adhesive member to the part of the second semiconductor chip.

5. The device according to claim 1, further comprising a third semiconductor chip stacked between the wiring board and the first semiconductor chip, wherein:
   the third semiconductor chip includes a plurality of bump electrodes, the third semiconductor chip is bonded on the wiring board via the plurality of bump electrodes; and
   the first semiconductor chip is stacked on the third semiconductor chip via the first adhesive member.

6. The device according to claim 1, wherein:
   the first semiconductor chip has an electrode pad formation region on one surface thereof; and
   the second semiconductor chip is stacked on a region of the one surface of the first semiconductor chip other than the electrode pad formation region.

7. The device according to claim 6, wherein the second semiconductor chip is smaller in size than the first semiconductor chip.

8. The device according to claim 6, wherein the first semiconductor chip and the second semiconductor chip are formed into a rectangular planar shape, and are stacked such that their longitudinal directions intersect with each other.

9. The device according to claim 1, wherein the second adhesive member is a single layer without including an insulating base, and the second adhesive member is in direct contact with the first semiconductor chip and with the second semiconductor chip.

10. A device comprising:
    a wiring board; and
    a plurality of semiconductor chips stacked on the wiring board, wherein an uppermost semiconductor chip of the plurality of semiconductor chips is bonded to an adjacent one of the semiconductor chips by a paste-type adhesive member, each of the other semiconductor chips is bonded to an adjacent one of the semiconductor chips or wiring board by a film-type adhesive member comprising a die attach film and an insulating base, an edge of the paste-type adhesive member is dented from an edge of the uppermost semiconductor chip, and an edge of the film-type adhesive member is substantially coplanar with an edge of the other semiconductor chips.

11. The device according to claim 10, further comprising a spacer between the plurality of semiconductor chips, the spacer being bonded to an adjacent one of the semiconductor chips by the film-type adhesive member.

12. The device according to claim 10, wherein the plurality of semiconductor chips comprising three or more semiconductor chips, a lowermost semiconductor chip includes a plurality of bump electrodes, and the lowermost semiconductor chip is bonded to the wiring board via the plurality of bump electrodes instead of using the film-type adhesive member.

13. The device according to claim 10, wherein the uppermost semiconductor chip of the plurality of semiconductor chips is smaller in size than the other semiconductor chips.

14. The device according to claim 10, wherein the plurality of semiconductor chips are each formed into a rectangular planar shape, and are stacked alternately such that the their longitudinal directions intersect with each other.

15. The device according to claim 10, wherein the paste-type adhesive member is a single layer without including an insulating base, and the paste-type adhesive member is in direct contact with a corresponding one of the other semiconductor chips and with adjacent one of the semiconductor chips.

16. A device comprising:

a wiring board;

a first semiconductor chip mounted on the wiring board by a first adhesive member, the first adhesive member comprising a die attach film including an insulating base, a lower adhesive layer adhered the wiring board to the insulating base, and an upper adhesive layer adhered the first semiconductor chip to the insulating base; and a second semiconductor chip stacked on the first semiconductor chip by a second adhesive member, and the second adhesive member comprising of an adhesive paste, wherein an edge of the first adhesive member is substantially coplanar with an edge of the first semiconductor chip, and an edge of the second adhesive member is dented from an edge of the second semiconductor chip.

17. The device according to claim 16, wherein the second adhesive member is a single layer without including an insulating base, and the second adhesive member is in direct contact with the first semiconductor chip and with the second semiconductor chip.

* * * * *

UNITED STATES PATENT AND TRADEMARK OFFICE
CERTIFICATE OF CORRECTION

| | | |
|---|---|---|
| PATENT NO. | : 9,252,126 B2 | Page 1 of 1 |
| APPLICATION NO. | : 13/796903 | |
| DATED | : February 2, 2016 | |
| INVENTOR(S) | : Atsushi Tomohiro | |

It is certified that error appears in the above-identified patent and that said Letters Patent is hereby corrected as shown below:

In the Claims

Claim 14, column 11, line 28 should read "planar shape, and are stacked alternately such that their"

Claim 15, column 12, line 5 should read "ductor chips and with the adjacent one of the semiconductor"

Claim 16, column 12, line 18 should read "ond adhesive member comprising an adhesive paste,"

Signed and Sealed this
Third Day of May, 2016

Michelle K. Lee
*Director of the United States Patent and Trademark Office*